United States Patent [19]

Matrone

[11] 4,352,061
[45] Sep. 28, 1982

[54] UNIVERSAL TEST FIXTURE EMPLOYING INTERCHANGEABLE WIRED PERSONALIZERS

[75] Inventor: John L. Matrone, Guilderland, N.Y.

[73] Assignee: Fairchild Camera & Instrument Corp., Mountain View, Calif.

[21] Appl. No.: 42,116

[22] Filed: May 24, 1979

[51] Int. Cl.³ .................... G01R 31/02; H01R 4/64
[52] U.S. Cl. .................. 324/158 F; 324/73 PC; 324/158 P; 339/117 P
[58] Field of Search .......... 324/158 F, 158 P, 73 PC, 324/72.5; 339/117 P

[56] References Cited

U.S. PATENT DOCUMENTS

| | | | |
|---|---|---|---|
| 3,176,091 | 3/1965 | Hanson et al. | 200/46 |
| 3,564,408 | 2/1971 | Schulz et al. | 324/158 |
| 3,654,585 | 4/1972 | Wickersham | 324/158 F |
| 4,017,793 | 4/1977 | Haines | 324/158 F |
| 4,108,528 | 8/1978 | Long et al. | 339/117 P |
| 4,115,735 | 9/1978 | Stanford | 324/158 F |
| 4,322,682 | 3/1982 | Schadwill | 324/158 F |

OTHER PUBLICATIONS

Tech. Bull. TB 7005-1; "Formed Pin Transition Board"; 1976; Ditmco International; Kansas City, Mo.

Primary Examiner—Ernest F. Karlsen
Attorney, Agent, or Firm—Kenneth Olsen; Theodore S. Park; Michael J. Pollock

[57] ABSTRACT

A universe of probes is contained within a platen in a spaced-apart, substantially parallel relationship with one another with their tips pointing in the same direction. Each probe is free to move longitudinally between an advanced or test position and a retracted position. The platen nests into a wired personalizer having probe selector posts upstanding therein in a pattern corresponding to the pattern of test points on a circuit board to be tested. These posts serve to push up or advance the probes needed to test a particular type of circuit board. The posts are conductive and each is individually connected to the test system. The circuit board to be tested rests on a special deformable gasket so that its test points are suspended over and aligned with the advanced test probes. When the fixture is evacuated, the circuit board to be tested is drawn downwardly so that the test points on the board make electrical contact with the tips of the advanced probes.

16 Claims, 4 Drawing Figures

4,352,061

UNIVERSAL TEST FIXTURE EMPLOYING INTERCHANGEABLE WIRED PERSONALIZERS

BACKGROUND OF THE INVENTION

1. Field of the Invention

This invention relates to fixtures of the bed of nails type used to electrically connect a printed circuit board to be tested with an automatic test system.

2. Description of the Prior Art

As is well known, it is becoming a routine matter among manufacturers to test circuit boards which they intend to use in producing products such as televisions, electronic organs, and many, many others. These tests can be conducted with so-called "bare" boards and with "loaded" boards. A bare board is one not having components mounted thereon while a loaded board is one having these components in place.

In conducting such tests, it is, of course, necessary to have a device commonly called a "fixture" which serves to make an electrical connection between the nodal points in the circuit to be tested and the test system. A standard approach is to use a "bed of nails" fixture. This device derives its name from the fact that it is comprised of a great number of nail-like test probes having tips to make electrical contact with the nodal points of the circuit to be tested. These probes are individually connected through one or more interfacing devices to the test system.

It has been the practice for manufacturers to purchase one fixture for each type of board to be tested. This has been primarily due to the fact that fixtures have largely been custom-made. One would lay out the pattern of nodal points to be used in a test and an array of test probes would be provided in that pattern in one fixture. As the number of boards one must test grows, this becomes an expensive proposition. The expense is due primarily to the high number of probes involved. Test probes are typically spring-loaded and gold-plated and are manufactured to fairly close tolerances. It is not difficult to imagine, then, that a substantial investment is involved if a manufacturer, as is now the practice, is required to maintain an inventory of several fixtures, each containing many such probes.

It would, therefore, be advantageous to provide a universal fixture which could be used to test many different types of circuit boards. It can be expected that such a fixture would represent a relatively large initial investment because it would need to contain more probes than would ordinarily be required to test a single board. In the long run, however, this approach would prove to be a more economical one for manufacturers who are required to test many types of boards.

SUMMARY OF THE INVENTION

It is, therefore, an object of this invention to provide a universal fixture suitable for measuring a plurality of different types of printed circuit boards using the same universe of probes each time.

It is a further object of this invention to provide a universal fixture in which the only parts which must be changed to test different types of circuit boards are the relatively inexpensive parts of the fixture.

It is a further object of this invention to provide a universal fixture which can be easily connected to a test system and in which the changeable parts can be easily and quickly substituted for one another.

Finally, it is an object of this invention to provide a universal fixture of the bed of nails type in which the probes will operate accurately and efficiently over a great number of tests.

The invention is a test fixture containing a universe or collection of test probes which can be used to test a number of different types of printed circuit boards. The probes are contained in a universal matrix platen and are arranged in a pattern suitable for testing a number of different circuit boards. The universal matrix platen is assembled as a middle layer between a wired personalizer and the circuit board to be tested. The wired personalizer has a number of rod-like, probe selector posts upstanding therein in a pattern matching the pattern of test points on a particular circuit board to be tested. The probe selector posts serve to push up or advance certain of the test probes so that they protrude out of the platen in a pattern matching the pattern of test points. The circuit board, mounted over the probes on a special movable gasket, is moved toward the advanced or selected probes in order to bring its test points into contact with them. Since each probe selector post is conductive and is wired to the automatic test system, electrical contact is established between the individual test points and the test system. To test different types of boards, different wired personalizers are used having patterns of probe selector posts matching the patterns of test points on the boards to be tested.

DESCRIPTION OF THE PREFERRED EMBODIMENTS

Figure 1:
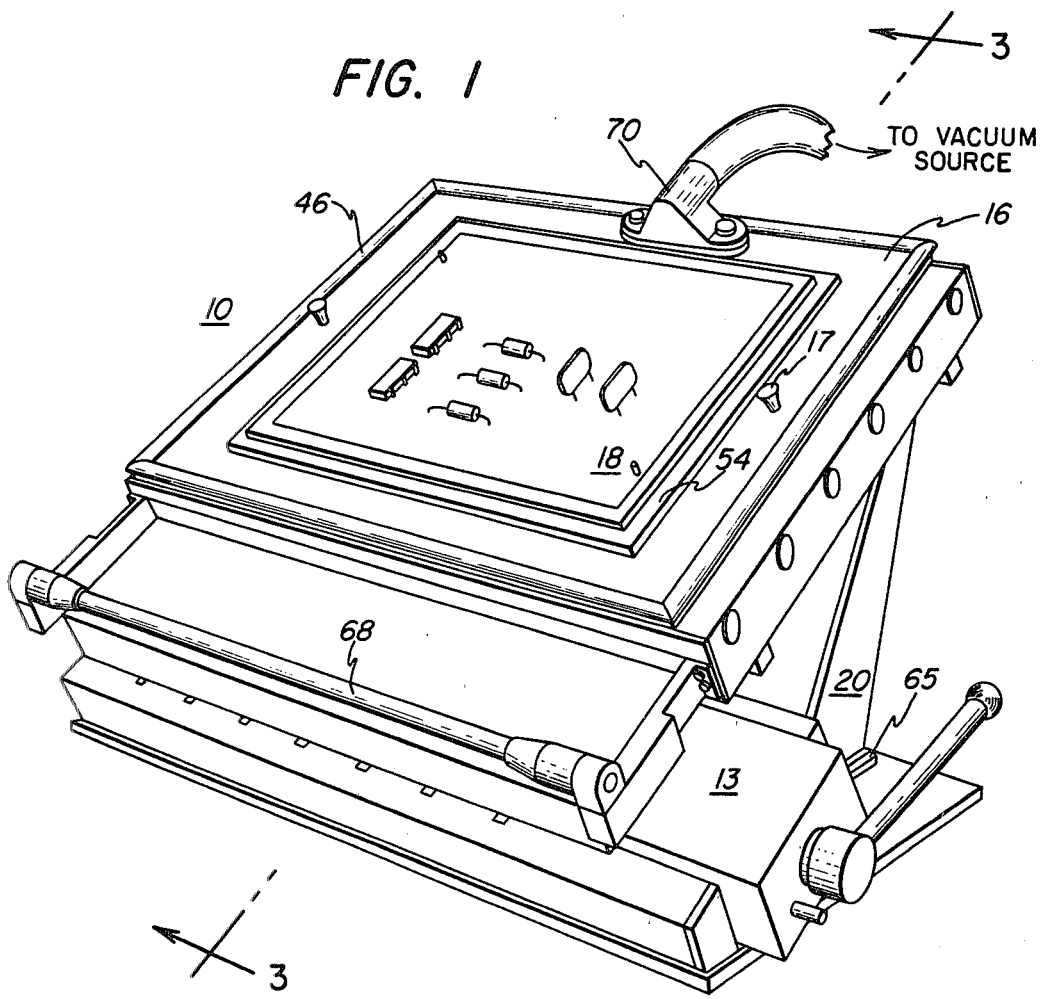
FIG. 1 is a perspective view of an embodiment of the invention shown in assembled form on a receiver of an automatic test system (not shown).

Referring to FIG. 1, there is shown a fixture 10 according to the present invention mounted on a receiver 13. The function of receiver 13 is to mechanically and electrically connect fixture 10 to an automatic test system. To do this, receiver 13 cooperates with contact panel 26 and mating guides 27, both shown in FIG. 2, in the same way that these structures cooperate in U.S. patent application, Ser. No. 868,822, filed Jan. 12, 1978, now U.S. Pat. No. 4,230,985, "Interchangeable Printed Circuit Board Test Fixtures and a Receiver Therefor," Matrone et al., and whose contents are hereby incorporated by reference herein.

It will be understood that receiver 13 is usually mounted on a countertop surface as part of an automatic test system, although the countertop surface is not depicted in the figures.

Figure 2:
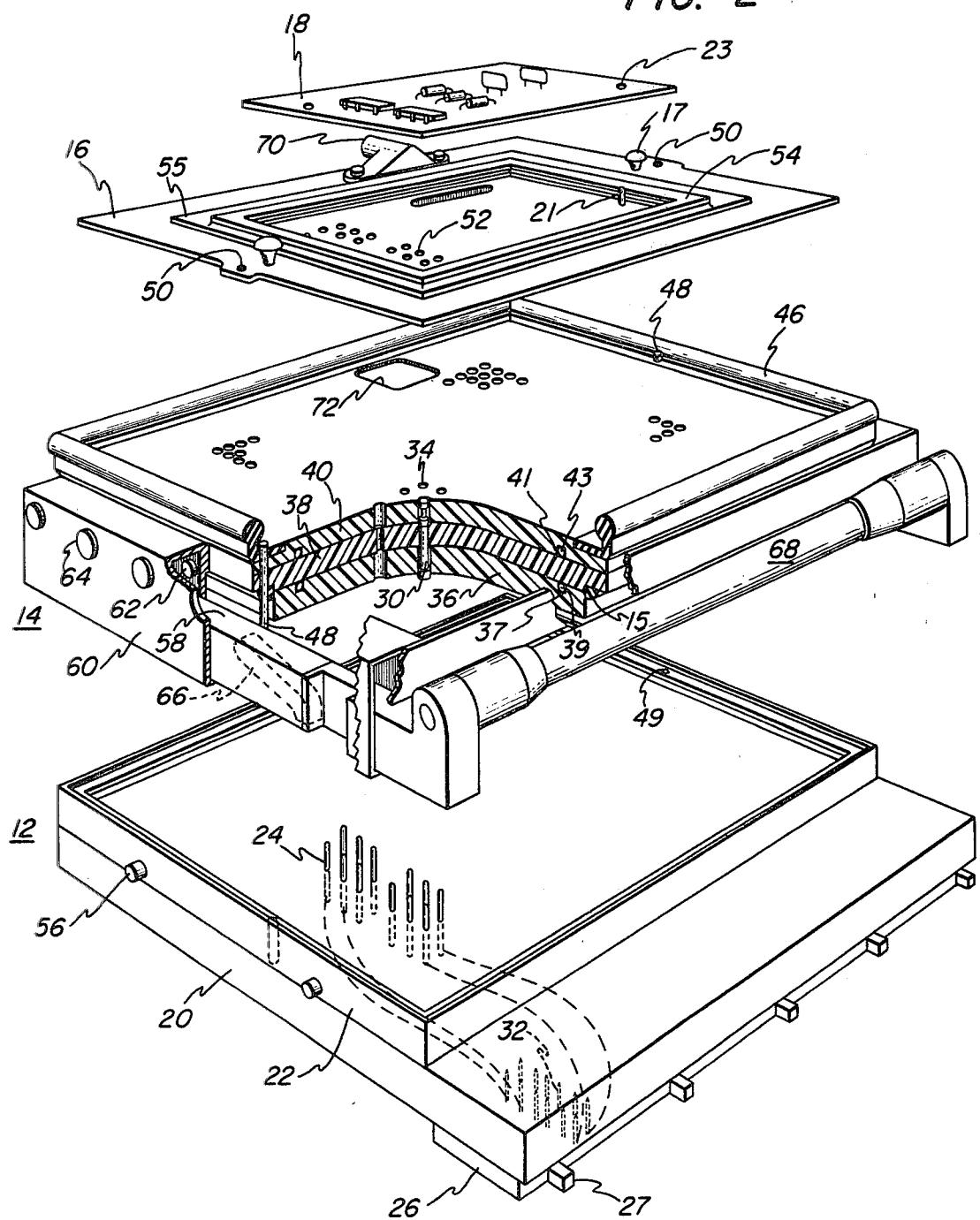
FIG. 2 is an exploded view of the embodiment of FIG. 1 with parts broken away.

In FIG. 2, it will be seen that fixture 10 is comprised of a number of major parts. The part which is intended to be attached to the receiver 13, shown in FIG. 1, is product access unit 12. For reasons which will become clearer hereinafter, this part is also known as a "wired personalizer". Wired personalizer 12 is intended to hold universal matrix platen 14. The overall configuration of universal matrix platen 14 is such that it will nest into wired personalizer 12. Top plate 16, in turn, is intended to rest on universal matrix platen 14. A printed circuit board 18, to be tested, rests on top plate 16.

Figure 3:
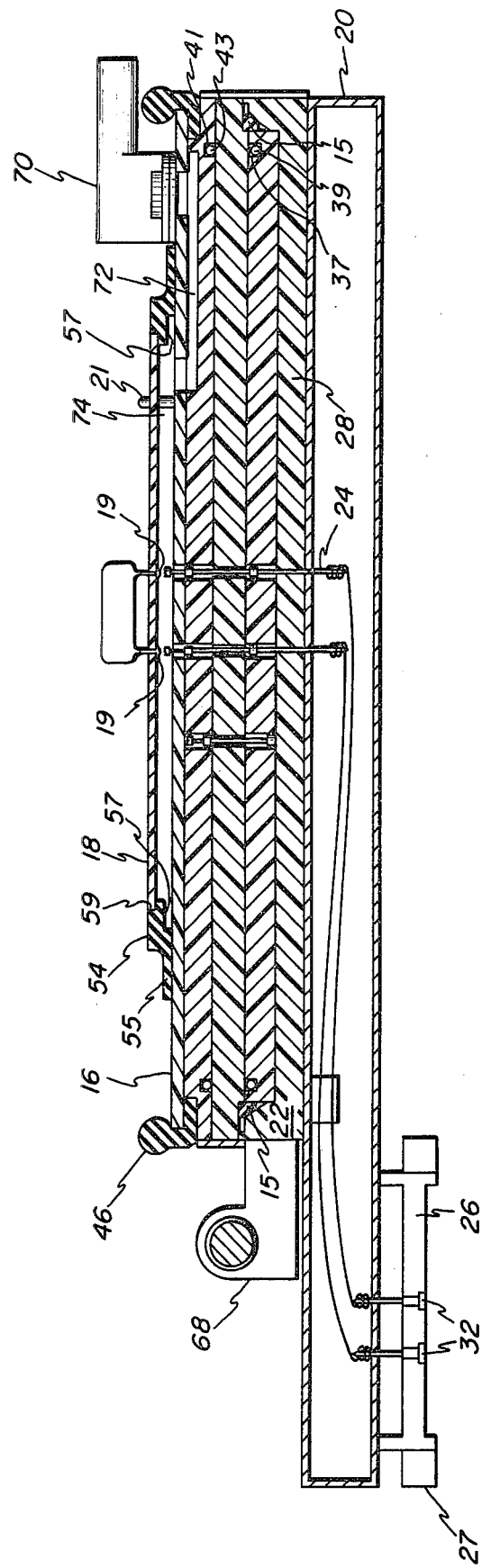
FIG. 3 is a cross-sectional view taken on line 3—3 of FIG. 1.

Product access unit 12 serves as a mechanical and electrical connecting link to an automatic test system. Its basic structural parts include sheet metal frame 20, well 22 and contact panel 26. Well 22 may be made of molded, reinforced fiberglass and may be fastened to frame 20 in any suitable manner, such as by using screws. Contact panel 26 may be attached to frame 20 in the manner described in the patent application identified above. Rigidly mounted in contact panel 26 are contact posts 32. Contact posts 32 are the same in structure and function as those shown and described in the above identified patent application. They serve to make individual electrical connections between the test system and circuit paths leading to individual test probes. Probe selector posts 24 are rigidly mounted in the bottom of well 22. Posts 24 are rod-like structures which are mounted so as to protrude both above and below the bottom wall 28 of well 22, as shown in FIG. 3. Posts 24 are constructed of a suitable electrically conductive material and are electrically wired to contact posts 32 for ultimate connection with the automatic test system.

Figure 4:
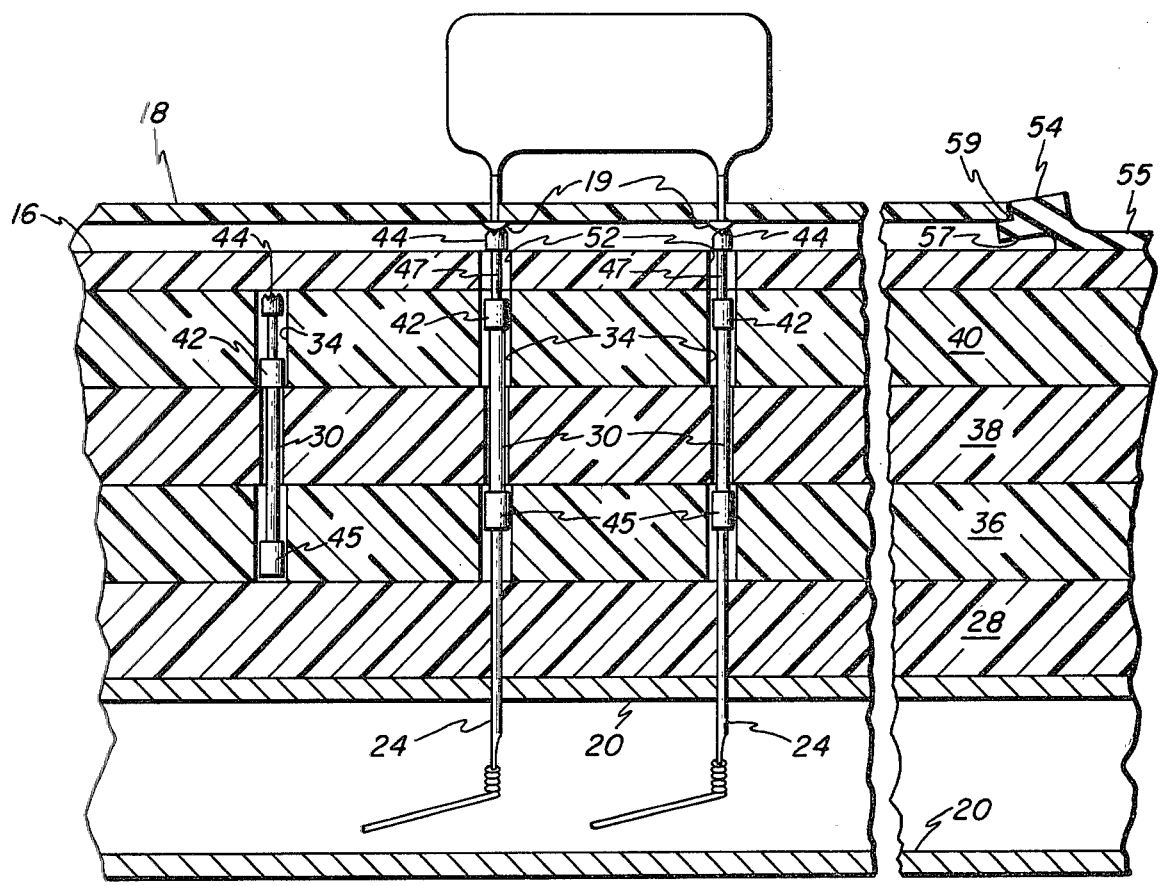
FIG. 4 is an enlarged view of a portion of FIG. 3.

Universal matrix platen 14 contains a plurality of test probes 47, each mounted in a test probe receptacle 30, most clearly shown in FIG. 4. Test probes 47 are preferably of the spring-loaded, pluggable type readily available in the marketplace. The combination of test probe 47 mounted in test probe receptacle 30 may be referred to as a test probe assembly.

Each test probe assembly is slideably mounted in a hole 34 within universal matrix platen 14, as shown in FIGS. 2, 3 and 4. Universal matrix platen 14 may contain between 10,000 and 30,000 probe assemblies. These probe assemblies may be mounted in any desirable pattern for testing a number of different types of printed circuit boards and can be located on 100 mil centers from each other using the materials and techniques described herein.

Universal matrix platen 14 is made up of a bottom section 36, a middle section 38 and a top section 40 having a combined thickness of about 1.5 inches. The material used for these sections may be Delren or any other non-conductive material of sufficient structural strength which can be machined. An advantage in using three separate thickness or sections for universal matrix platen 14 concerns the drilling of holes 34. The probe receptacles 30 and probes 47 should be mounted so that they are substantially parallel with one another which, of course, requires that holes 34 be substantially parallel with one another. Because holes 34 are fairly small in diameter, it is very difficult to maintain the desired alignment in drilling through a 1.5 inch thickness because the drill bit tends to "wander". This difficulty is substantially overcome by using the separate sections 36, 38 and 40.

Test probe receptacles 30 are preferably captured in holes 34. As shown in FIG. 4, each hole 34 is narrower as it passes through middle section 38. In practice, a diameter of 93 mils for hole 34 is satisfactory for bottom section 36 and top section 40. A diameter of 73 mils is satisfactory for middle section 38. The capturing of a probe receptacle 30, and thus, probe 47 is accomplished by the use of a collar 42 and a button 45. Collar 42 can be press-fitted on that portion of receptacle 30 which passes through upper section 40 of the universal matrix platen. Collar 42 is sized so that it will be free to slide up and down within hole 34 in top section 40. The outside diameter of collar 42, however, should be large enough to prevent any significant lateral movement and to prevent its passing through middle section 38. Probe receptacle 30 is likewise sized so that it will freely slide longitudinally through hole 34 in middle section 38. But, again, its outside diameter should be large enough to eliminate any significant lateral movement. The sizing of collars 42 and receptacles 30 with relation to hole 34, as just described, serve to maintain the alignment of receptacles 30 and thus, probes 47 with holes 34 as the probe assemblies move longitudinally in holes 34.

The final part involved in the capturing of probe receptacles 30 within universal matrix platen 14 is button 45 which is press-fitted to the bottom of each receptacle 30. One end of button 45 is therefore open to accept the end of receptacle 30. The other end of button 45 is closed and preferably shaped concavely or conically. Such shapes tend to promote a good electrical contact between probe selector posts 24 and button 45. It is also desirable to gold-plate the contacting surfaces of these two parts to assure a minimum of electrical contact resistance. The outside diameter of button 45 is small enough to permit it to freely slide longitudinally in hole 34 in bottom section 36. The outside diameter of button 45 is too large, however, to permit it to pass through middle section 38. Thus, probe receptacle 30 and probe 47 are captured within universal matrix platen 14. The probe assembly can move longitudinally, but no significant lateral movement is possible.

The three sections of universal matrix platen 14 are preferably joined together with light bolts and nuts, although these are not illustrated in the figures. As best shown in FIG. 3, top section 40 and bottom section 36 are provided with groves 41 and 37, respectively, which travel continuously around each section near its edge. Each is provided with an "O" ring seal, 43 and 39, respectively. In this way, a vacuum type seal is made between the three sections outside of the area through which the probe assemblies pass. An additional seal 15 is provided between well 22 and universal matrix platen 14 where it nests therein, as illustrated in FIG. 3. Alignment studs 48 are rigidly mounted through top section 40 and middle section 38, as shown in FIG. 2. Studs 48 cooperate with holes 49 in well 22 to assure accurate alignment of universal matrix platen 14 with wired personalizer 12. It can be noted that studs 48 protrude upwardly from universal matrix platen 14. Holes 50 are provided in top plate 16 in order to assure its accurate alignment when assembled with platen 14.

Universal matrix platen 14 is provided with a beaded gasket 46, most clearly shown in FIGS. 2 and 3. The function of gasket 46 is to initially secure and form a vacuum seal with top plate 16 when it is placed on universal matrix platen 14. Top plate 16 is also provided with a number of top plate apertures 52 which permit the tips of probes 47 to pass therethrough as illustrated in FIG. 4. Apertures 52 are necessarily above the selected probe assemblies (i.e., those probe assemblies contacting probe selector posts 24) and may optionally also be above some or all of the remaining or unselected probe assemblies (i.e., those probe assemblies not contacting any of posts 24). As shown in FIGS. 2 and 3, top plate 16 is also provided with top plate gasket 54 which serves to hold the printed circuit board 18 to be tested. Gasket 54 also serves to maintain a vacuum seal between the edge of printed circuit board 18 and top plate 16. This vacuum seal is maintained even when circuit board 18 is drawn downwardly as will be more fully described below. The cross-sectional configuration illustrated for gasket 54 in FIGS. 3 and 4 is preferable in that it permits the gasket to be formed with a minimal thickness. This, in turn, tends to keep the circuit board 18 closer to the universal matrix platen, thereby reducing the distance between the test points on circuit board 18 and the tips 44 of test probes 47. Keeping this distance relatively small is important because it reduces the amount of travel necessary to bring board 18 into contact with tips 44, thereby adding to the accuracy and repeatability characteristics of the invention. In the embodiment illustrated, the downward travel of board 18 amounts to about 3/16 inch. It will be noted, as shown in FIG. 3, that gasket 54 is formed with a base 55 and a lip 57. Lip 57 is provided with a recess 59 into which circuit board 18 fits. The configuration of recess 59 is essentially the same in shape and size as the perimeter of the circuit board 18 to be tested. It, therefore, serves to assist in the general alignment of circuit board 18 with top plate 16. Final alignment is achieved through the use of guide pins 21 which are rigidly mounted in top plate 16 and which cooperate with guide holes 23 in the printed circuit board 18 to be tested.

It should be noted that lip 57 extends outwardly from base 55 and overhangs a portion of space 74 which is to be evacuated. When space 74 is evacuated, as will be described below, gasket 54 will deform in the general manner indicated in FIG. 4, thereby permitting circuit board 18 to travel downwardly to establish contact between its test points 19 and probe tips 44.

Universal matrix platen 14 is joined with wired personalizer 12 by means of mating guides 56 rigidly mounted in the sidewalls of well 22 and tracks 58 slideably mounted in housings 60 on universal platen 14, said structures being best illustrated in FIG. 2. Housing 60 is secured to middle section 38 of platen 14 by screws 62. Screws 62 are accessible through openings 64 in housing 60. Track 58 is mounted to slide longitudinally in housing 60. Inclined channels 66, shown in phantom in FIG. 2, serve to provide camming surfaces which cooperate with mating guides 56. Actuator handle 68 provides a means to slide tracks 58 in and out with respect to platen 14 in order to effect a connection and disconnection of platen 14 with wired personalizer 12. Tracks 66 also provide for the gradual lowering of platen 14 into personalizer 12 while alignment is maintained by guide pins 48.

As indicated previously, personalizer 12 is provided with probe selector posts 24 in a pattern matching that of the test points contained on circuit board 18. Assuming that the universe of probes 47 contained in platen 14 will have a probe suitably located for each test point on a particular board to be tested, probe selector posts 24 will function to cause these selected probes to be advanced upwardly with respect to platen 14 and to protrude from the top thereof, as illustrated in FIGS. 3 and 4.

Top plate 16 is provided with a vacuum port 70. Top section 40 of platen 14 contains a void 72 at a location which permits it to provide communication between space 74 and vacuum port 40.

In operation, the personalizer 12 would first be attached to receiver 13 of an automatic test system. Then universal matrix platen 14 would be placed upon personalizer 12 and secured thereto by operation of actuator handle 68. Next, top plate 16 would be placed upon platen 14 using knobs 17 for ease of handling. As indicated above, studs 48 provide alignment between personalizer 12, platen 14 and top plate 16. Finally, a circuit board 18 to be tested is placed within recess 59 of gasket 54, the proper alignment of circuit board 18 being assured by alignment pins 21. Before the test is conducted, a vacuum is applied through vacuum port 70 which draws board 18 downwardly into contact with the selected probes which have been advanced by the strategically placed posts 24. It should be noted that the entire fixture 10 is evacuated between circuit board 18 and well 22. This occurs because of the presence of the large number of probe assemblies in holes 34 found within platen 14. The result in beneficial in that it tends to draw platen 14 more tightly against well 22, assuring proper seating and again adding to the accuracy and repeatability characteristics of the invention. When the test of a board 18 has been completed, the vacuum is released and the board is removed. Another board 18 is placed on gasket 44 and the process is repeated.

It will be appreciated that boards having different patterns of test points can be tested with this invention by changing certain parts of it. Personalizer 12 and top plate 16 would be changed while universal matrix platen 14 would not. Even top plate 16 may be retained if each new board is the same size as original board 18 and apertures 52 exist at least above all the probe assemblies encompassed within the area of board 18. As indicated earlier, the platen 14 is by far the most expensive part of the fixture and the personalizer 12 and the top plate 16 are relatively inexpensive. Where one desires to test a number of different types of circuit boards, the invention can result in an overall savings in costs by eliminating the need to have a separate fixture, each with its own array of test probes, for each type of board to be tested. The need for storage space is also reduced since the personalizers and top plates to be stored generally are thinner than individual fixtures of the conventional type.

There are, of course, many modifications which can be made to the preferred embodiment of this invention, just described, without departing from its spirit. For example, the probe assemblies could be made structurally simpler by eliminating the special receptacles 30 and just capturing a spring-loaded probe within universal matrix platen 14. The probe could have a suitable base, like button 45, and would thus function effectively as the probe assembly described above functions. Of course, the convenience and versatility of having pluggable probes—being able to change probe types or to easily replace damaged probes—would be lost. Nevertheless, it should be understood that any probe assembly having a suitable tip for contacting a test point and a base for contacting a probe selector post will work.

Also, the universal matrix platen could be formed as a single thickness, or some other means for holding test probe assemblies could be substituted in its place; a means other than a vacuum system could be used to bring the circuit board and the tips of the selected probes together; and many other modifications could be made. It is intended that all such modifications be encompassed within the scope of the following claims.

I claim:
1. A printed circuit board test fixture comprising:
    a universal matrix device which includes a plurality of electrical spring loaded test probe assemblies, each probe assembly having a longitudinal axis with a tip at one end and a contact surface at the other end, and a means for holding the probe assemblies spaced apart from one another with the axes substantially parallel to one another and with the tips pointing substantially in the same direction wherein the means for holding include a test probe assembly at every point where a test point is desired for a family of various types of different printed circuit boards to be tested;

a support having rigid posts mounted through it equal in number and corresponding in locations on a one-to-one basis both to test points of the particular circuit board under test and to selected probe assemblies of the plurality of probe assemblies of the universal matrix device;

means for positioning the universal matrix relative to the support so that one end of each post makes contact with a contact surface of the corresponding selected assembly, thereby selecting the electrical test probe assemblies required for testing a required number of test points of the particular type of printed circuit board under test; and means for bringing the tip of each selected assembly and its corresponding test point together to contact each other.

2. A test fixture as in claim 1 wherein: each probe assembly is movable along its axis between a retracted position and an advanced position which is closer to the particular board than is the retracted position; and each selected assembly is urged to its advanced position as its contact surface contacts the corresponding post.

3. A test fixture as in claim 2 wherein the tips of the selected assemblies at their advanced positions do not contact the test points when the means for bringing are not actuated.

4. A test fixture as in claim 3 wherein each remaining assembly of the probe assemblies substantially stays at its retracted position and does not contact the particular board.

5. A test fixture as in claim 3 wherein the posts are substantially parallel to one another.

6. A test fixture as in claim 5 wherein the means for holding comprises a platen having a like plurality of holes therethrough corresponding on a one-to-one basis to the probe assemblies, each probe assembly slideably mounted along its axis in its corresponding hole.

7. A test fixture as in claim 1, 2, 3, 4, 5, or 6 wherein: the contact between each post and the corresponding selected assembly is electrical; and the other end of each post is electrically connected to a system for testing the particular board.

8. A test fixture as in claim 1, 2, 3, 4, 5, or 6 wherein: the probe assemblies are selectively sufficient for testing each board of a second plurality of different types of printed circuit boards; the support is one of a like second plurality of interchangeable personalized supports corresponding on a one-to-one basis to the types of boards; each other support has posts mounted through it at locations corresponding on a one-to-one basis both to test points of the corresponding type of board and to selected assemblies of the probe assemblies; and each other support is placeable in the fixture so that each post thereof can contact the contact surface of the corresponding selected assembly to urge it to its advanced position.

9. A test fixture as in claim 8 wherein at least one but not all of the selected assemblies for one of the supports is common to the selected assemblies for another of the supports.

10. A test fixture as in claim 8 wherein the area of the means for holding generally enclosed by the posts for one of the supports at least partially overlaps the area of the means for holding generally enclosed by the posts for another of the supports.

11. A test fixture as in claim 6 wherein the means for securing movably secures the platen and the particular board to each other.

12. A test fixture as in claim 6 wherein the means for securing comprises: a top plate mounted on the platen and having apertures formed through it at locations corresponding on a one-to-one basis to the selected assemblies, each aperture being sufficiently large to permit its corresponding selected assembly to pass through it; and a deformable gasket mounted on the top plate for receiving the particular board and for allowing it to move toward the selected assemblies.

13. A test fixture as in claim 12 wherein the means for bringing is vacuum operated and comprises a vacuum port, the tip of each selected assembly and its corresponding test point coming together upon application of a suitable vacuum to the test fixture through the vacuum port.

14. A test fixture as in claim 13 wherein the gasket comprises: a base affixed to the top plate; and a lip extending inwardly from the base and defining a frame of generally the same shape as the perimeter of the particular board but of slightly smaller interior dimension to prevent the particular board from passing through the gasket when placed thereon in alignment therewith.

15. A test fixture as in claim 14 wherein the lip has a recess along the entire interior edge of the frame at its surface furthest from the top plate, the recess being of substantially the same size and shape as the perimeter of the particular board.

16. A test fixture as in claim 13 wherein: the support comprises a vacuum well having side walls and a substantially flat bottom wall; at least part of the platen is mounted between the side walls generally perpendicular to the bottom wall; and the probe assemblies are mounted through the bottom wall generally perpendicular to it.

* * * * *